United States Patent

Huang-Lu et al.

[11] Patent Number: 5,990,519
[45] Date of Patent: Nov. 23, 1999

[54] ELECTROSTATIC DISCHARGE STRUCTURE

[75] Inventors: Shiang Huang-Lu, Hsinchu; Tien-Hao Tang, Chungho; Kuan-Yu Fu, Hsinchu, all of Taiwan

[73] Assignee: United Microelectronics Corp., Hsinchu, Taiwan

[21] Appl. No.: 09/200,891

[22] Filed: Nov. 27, 1998

[51] Int. Cl.$^6$ ................................. H01L 23/62
[52] U.S. Cl. .................. 257/357; 257/355; 257/356; 257/358; 257/623; 438/411; 438/421
[58] Field of Search ..................... 257/355, 363, 257/623, 522, 546, 173; 438/411, 421

[56] References Cited

U.S. PATENT DOCUMENTS

| | | | |
|---|---|---|---|
| 5,243,205 | 9/1993 | Kitagawa et al. | 257/173 |
| 5,684,323 | 11/1997 | Tohyama | 257/363 |
| 5,786,613 | 7/1998 | Kalnitsky | 257/355 |

*Primary Examiner*—Valencia Martin-Wallace
*Assistant Examiner*—H. D. Tran
*Attorney, Agent, or Firm*—Oblon, Spivak, McClelland, Maier & Neustadt, P.C.

[57] ABSTRACT

A spike electrostatic discharge (ESD) cavity structure includes an etching stop layer including, for example, polysilicon or metal material. The etching stop layer is used as the etching stop to form an opening in the dielectric layer, inside of which a number of discharging layer pairs are formed. The opening exposes the end portions of the discharge layer pairs. The opening is a cavity and can be vacuumed or filled with air.

16 Claims, 2 Drawing Sheets

ELECTROSTATIC DISCHARGE STRUCTURE

BACKGROUND OF THE INVENTION

1. Field of the Invention

This invention relates to an electrostatic discharge (ESD) protection structure, and more particularly to a spike ESD structure for spike discharge without a dielectric layer in the discharging region.

2. Description of Related Art

In the fabrication of an integrated circuit (IC), ESD is one of the main factors causing IC damage. ESD is often seen in the work place. For example, when one walks on a carpet with semiconductor wafers, if relative humidity (RH) is high, an electrostatic voltage of about a few hundred volts may exist on one's body and wafers. If the RH is very low, the electrostatic voltage may be even as high as about a few thousand volts. If a conductive object occasionally contacts the wafers, a strong ESD could occur and damage the ICs on the wafers. ESD is an especially serious problem for fabrication of a complementary metal-oxide semiconductor (CMOS) device.

In order to protect wafers from ESD damage, many methods to solve the ESD problem have been proposed. The most common conventional method is to make an ESD protection circuit between input/output (I/O) pads and internal circuits so that the ESD does not damage the ICs fabricated on the wafers. Recently, the spike discharge ESD protection structure was investigated.

In above descriptions, the spike ESD phenomenon happens around the spike tips on a conductive object because the electric field on the spike tips is much stronger even though the electrostatic voltage is the same for the whole conductive object. The stronger electric field is due to a higher density of electrostatic surface charges on the spike tips, where the accumulated electrostatic surface charges are more easily triggered for discharging.

For example, FIG. 1 is a diagram schematically illustrating a conventional spike ESD structure. In FIG. 1, a structure IC devices basically includes a higher voltage source bus $V_{DD}2$, a lower voltage source bus $V_{SS}6$, and an input/output (I/O) pad 4. A pair of ESD spikes 8 and 10 is formed, and another pair of ESD spikes 12 and 14 is formed separately. Each of the ESD spike pairs provides a structure for discharging so that the IC is not affected and can not be damaged by ESD phenomena. This ESD structure thereby serves as a protection structure against ESD. Another example of a conventional protection method is to replace the ESD spikes 8, 10, 12, and 14 with a metal needle. FIG. 2 is a diagram schematically illustrating another conventional spike ESD structure. In FIG. 2, the box 15 and the box 16 are a pair of structures located between the voltage source buses 2, 6, and the I/O pad 4 in FIG. 1, such as a pair consisting of a $V_{DD}$ and an I/O PAD, a pair consisting of a $V_{DD}$ and a $V_{SS}$, or a pair consisting of an I/O pad and a $V_{SS}$. A spike ESD structure includes a metal needle 18, which can also behave as a spike ESD phenomenon. An even more effective protection against ESD includes several metal needles 18.

FIG. 3 is a cross-sectional view schematically illustrating a conventional spike ESD structure. In FIG. 3, a dielectric layer 22, with a number of metal layers 24 formed inside of it, is formed over a semiconductor substrate 20 to provide the spike ESD structure. Each of the metal layers 24 has its paired parts, separated from each other by a distance d. For example, two metal layers $M_N$ are paired and are separated by a distance "d" inside the dielectric layer 22. The gap between the metal pair $M_N$ is the place where the ESD occurs. Because the metal layers 24 are held by the dielectric layer 22, the distance "d" should be small enough to allow the ESD to occur through the dielectric layer 22.

SUMMARY OF THE INVENTION

It is therefore an objective of the present invention to provide a spike ESD cavity structure that improves the ESD efficiency in order to allow a loose requirement for the distance "d". The spike ESD cavity structure utilizes a pad mask and an etching stop layer of any polysilicon or metal to remove a portion of a dielectric layer, which is formed over a semiconductor substrate. A discharge cavity with an exposed spike structure is therefore formed. In this manner, the electrostatic charges are efficiently discharged and therefore the IC is protected.

In accordance with the foregoing and other objectives of the present invention, a spike ESD cavity structure of the invention includes a dielectric layer formed over a semiconductor substrate. A number of discharging layer pairs are embedded inside the dielectric layer. There is a little gap between two separated discharging layers of each pair. An opening exists on the dielectric layer to expose the gap so that the ends of the discharging layer pairs are exposed. The opening also exposes an etching stop layer, which is involved in etching the opening and is also embedded inside the dielectric layer between the substrate and the discharging layer pairs.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
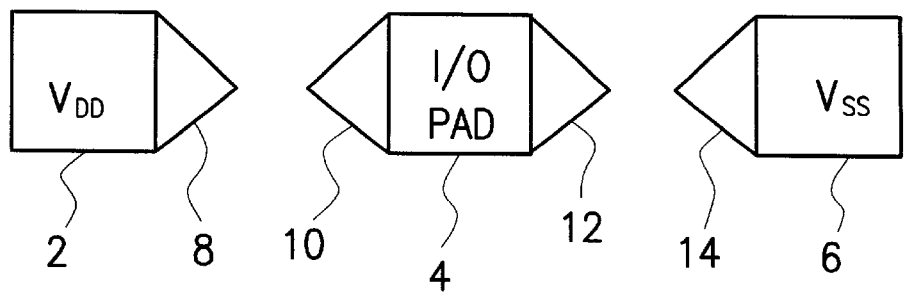
FIG. 1 is a diagram schematically illustrating a conventional spike ESD structure.
Figure 2:
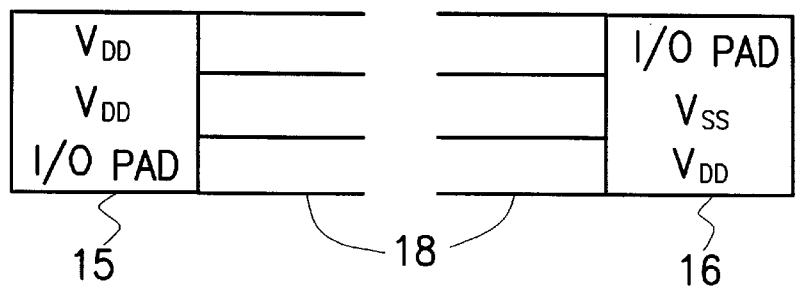
FIG. 2 is a diagram schematically illustrating an another conventional spike ESD structure.
Figure 3:
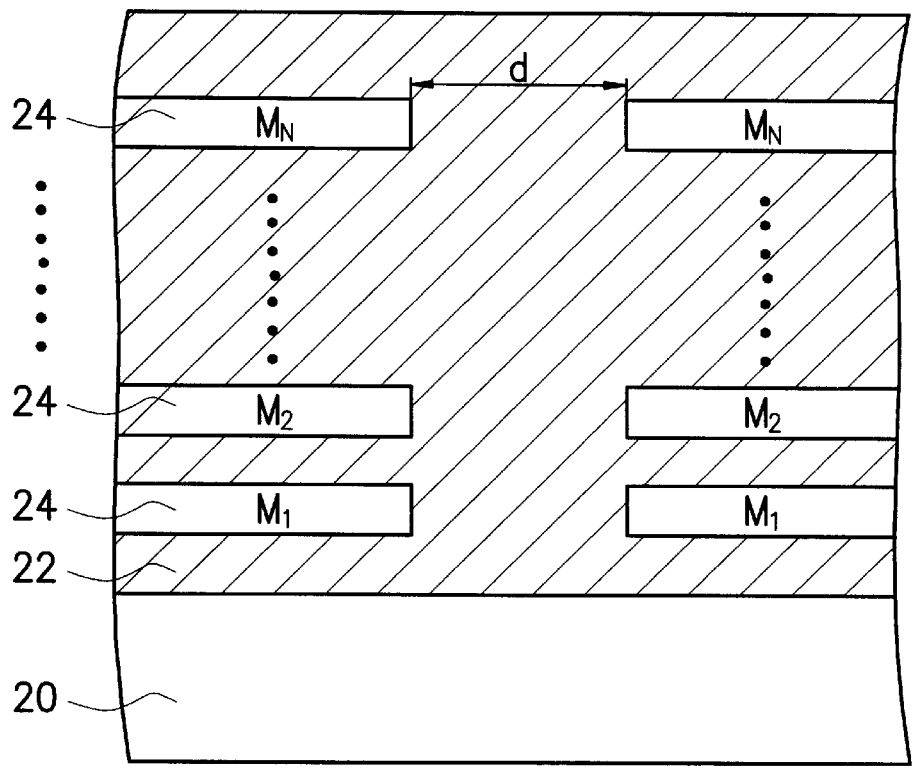
FIG. 3 is a cross sectional view schematically illustrating a conventional spike ESD structure.
Figure 4:
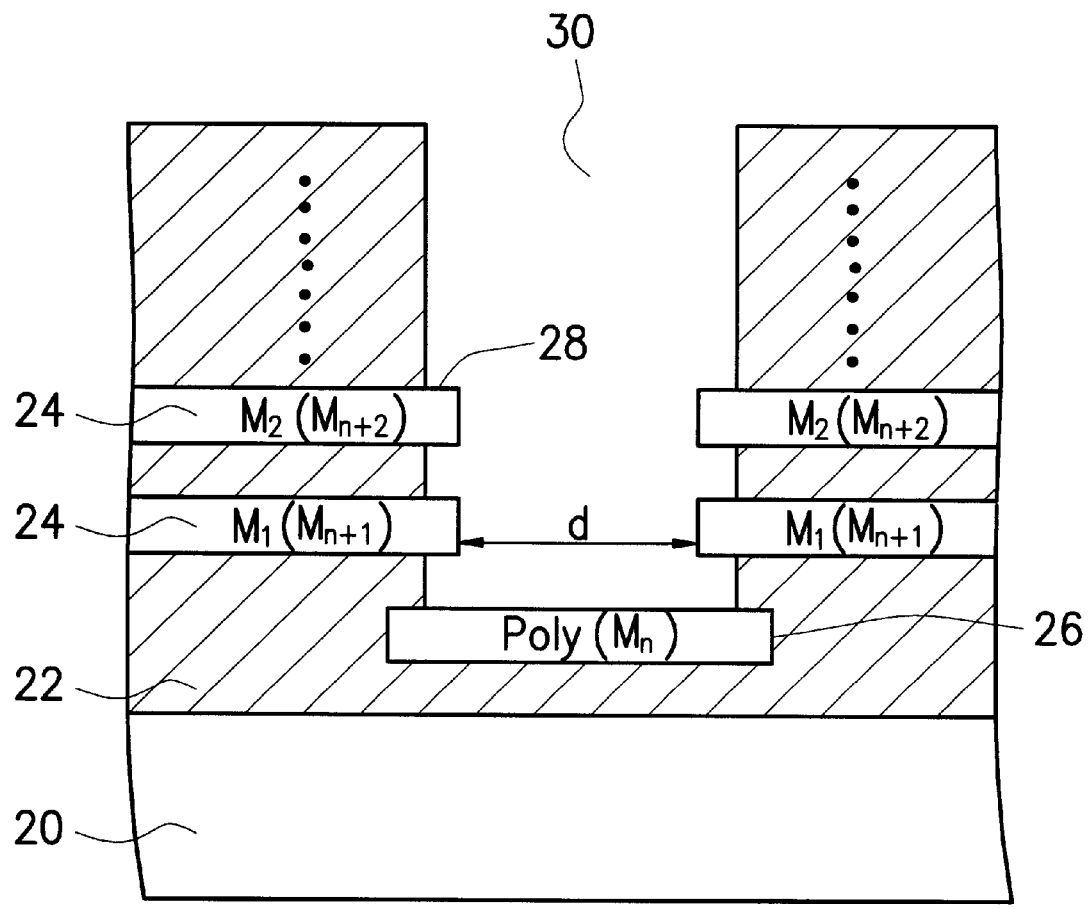
FIG. 4 is a cross sectional view schematically illustrating a spike ESD cavity structure, according to a preferred embodiment of the invention.

In FIG. 4, a spike ESD cavity structure includes a semiconductor substrate 20, a dielectric layer 22, an etching stop layer 26, an opening 30, and at least one discharging layer pair 24. In the preferred embodiment, a number of discharging layer pairs 24 ($M_1$, $M_2$, ... ) are shown. The dielectric layer 22 is on the substrate 20. The etching stop layer 26 including, for example, polysilicon or a metal material, is embedded inside the dielectric layer 22. The etching stop layer 26 can also, for example, be composed of N separate conductive layers (not shown), which include, for example, polysilicon or a metal material. The top layer, that is, polysilicon $M_n$, serves an etching stop point. Below the polysilicon or metal $M_n$, there may also be several similar discharging layer pairs 24 in several polysilicon or metal layers $M_1$ ... $M_{n-1}$ that are also embedded inside dielectric layer 22, with the polysilicon or metal layers being randomly located between the discharging layer pairs 24 and the substrate 20. Above the etching stop layer 26, the discharging layer pairs 24 are sequentially embedded inside the dielectric layer 22. The discharging layer pairs 24 can be, for example, made of metal with a cone-like structure or a needle-like structure. Each pair of the discharging layer pairs 24 has two discharging layers separated by a distance "d". The dielectric layer 22 is patterned by photolithography and etching. The etching stop layer 26 is used as an etching stop to form the opening 30, which exposes the etching stop layer 26. Within the opening 30, the end portions 28 of the discharging layer pairs 24 are also exposed. The opening 30 can be, for example, vacuumed or filled with air. The dielectric layer 22 includes, for example, silicon oxide.

In fabrication, it is difficult to reduce the distance "d" between the discharging layer pairs 24, but since the dielectric layer between the discharging layer pairs 24 is removed, the spike ESD is easier. This means that the required ESD conditions are looser.

In conclusion, the spike ESD cavity structure of the invention is characterized by the following. An etching stop layer 26 including, for example, polysilicon or metal material is used as the etching stop in the formation of the opening 30 on the dielectric layer 20. The opening 30 exposes the ends 28 of the discharging layer pairs 24. The opening 30 can be vacuumed or filled with air. In this cavity discharging structure, ESD is efficiently performed and the IC is thereby effectively protected.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A electrostatic discharge (ESD) structure comprising:
   a semiconductor substrate;
   a dielectric layer on the substrate;
   at least one discharging layer pair embedded inside the dielectric layer, wherein the at least one discharging layer pair comprises two discharging layers separated by a distance for discharging;
   at least one etching stop layer embedded inside the dielectric layer between the substrate and the at least one discharging layer pair; and
   an opening on the dielectric layer to expose the etching stop layer, wherein the opening also exposes a certain end portion of the separated discharging layers of the at least one discharging layer pair within the opening.

2. The ESD structure of claim 1, wherein the etching stop layer comprises polysilicon.

3. The ESD structure of claim 1, wherein the etching stop layer comprises a metal material.

4. The ESD structure of claim 1, herein the opening is formed by patterning the dielectric layer using the etching stop layer as the etching stop.

5. The ESD structure of claim 1, wherein the opening is filled with air.

6. The ESD structure of claim 1, wherein the opening is vacuumed.

7. The ESD structure of claim 1, wherein the at least one discharging layer pair comprises a metal material.

8. The ESD structure of claim 7, wherein the exposed end of the at least one discharging layer pair comprises a cone-like structure.

9. The ESD structure of claim 7, wherein the exposed end of the at least one discharging layer pair comprises a needle-like structure.

10. The ESD structure of claim 1, wherein the dielectric layer comprises silicon oxide.

11. An electrostatic discharge (ESD) structure comprising:
    a semiconductor substrate;
    a dielectric layer on the substrate;
    a plurality of discharging layer pairs embedded inside the dielectric layer, wherein each of the discharging layer pairs comprises two discharging layers separated by a distance for discharging;
    a plurality of etching stop layers embedded inside the dielectric layer randomly between the substrate and the discharging layer pairs; and
    an opening on the dielectric layer to expose a top layer of the etching stop layers, wherein the opening also exposes a certain end portion of the separated discharging layers of the discharging layer pairs within the opening.

12. The ESD structure of claim 11, wherein the etching stop layers comprise polysilicon.

13. The ESD structure of claim 11, wherein the etching stop layers comprise metallic material.

14. The ESD structure of claim 11, wherein the discharging layer pairs comprise metallic material.

15. The ESD structure of claim 11, wherein ends of the two discharging layers of each of the discharging layer pairs comprise a cone-like structure.

16. The ESD structure of claim 11, wherein ends of the two discharging layers of each of the discharging layer pairs comprise a needle-like structure.

* * * * *